United States Patent
Tallam et al.

(10) Patent No.: US 7,848,122 B2
(45) Date of Patent: Dec. 7, 2010

(54) TERMINATOR FOR REDUCING DIFFERENTIAL-MODE AND COMMON-MODE VOLTAGE REFLECTIONS IN AC MOTOR DRIVES

(75) Inventors: Rangarajan M. Tallam, Germantown, WI (US); Gary L. Skibinski, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 409 days.

(21) Appl. No.: 12/108,386

(22) Filed: Apr. 23, 2008

(65) Prior Publication Data

US 2009/0267431 A1 Oct. 29, 2009

(51) Int. Cl.
*H02M 1/12* (2006.01)
*H02M 1/14* (2006.01)

(52) U.S. Cl. .......................... 363/39; 307/105; 361/23; 361/31; 361/1; 361/110; 361/118; 333/167

(58) Field of Classification Search ............... 361/23, 361/31, 1, 110, 118; 363/39; 329/108; 307/105
See application file for complete search history.

(56) References Cited

U.S. PATENT DOCUMENTS

| | | | | |
|---|---|---|---|---|
| 2,246,926 A | * | 6/1941 | Roman | 307/105 |
| 3,668,507 A | * | 6/1972 | Kadomsky et al. | 363/126 |
| 3,894,274 A | * | 7/1975 | Rosenberry, Jr. | 361/23 |
| 4,494,163 A | * | 1/1985 | Yelland et al. | 361/56 |
| 4,862,341 A | * | 8/1989 | Cook | 363/37 |
| 5,686,806 A | * | 11/1997 | Hibbard | 318/800 |
| 5,831,410 A | | 11/1998 | Skibinski | |
| 5,990,654 A | * | 11/1999 | Skibinski et al. | 318/800 |
| 6,304,013 B1 | * | 10/2001 | Akers et al. | 310/68 R |
| 7,050,279 B2 | * | 5/2006 | Nojima | 361/42 |

OTHER PUBLICATIONS

Bolsens, B., et al., Transmission Line Effects on Motor Feed Cables: Terminator Design and Analysis in the Laplace-Domain, Electric Machines and Drives Conference, 2003, IEMDC '03, IEEE International, vol. 3, Jun. 1-4, 2003, pp. 1866-1872, IEEE, Los Alamitos, California, USA.

* cited by examiner

*Primary Examiner*—Rita Leykin
(74) *Attorney, Agent, or Firm*—Boyle Fredrickson LLP; Alexander R. Kuszewski; John M. Miller

(57) ABSTRACT

A terminator reduces reflections on power lines connecting an inverter to an AC motor by providing a differential-mode reflection damping element and at least one common-mode reflection damping element, the latter including a series capacitance to substantially reduce power dissipation in the resistance of the damping elements.

9 Claims, 1 Drawing Sheet

TERMINATOR FOR REDUCING DIFFERENTIAL-MODE AND COMMON-MODE VOLTAGE REFLECTIONS IN AC MOTOR DRIVES

CROSS-REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present invention relates to three-phase AC motor drives and particularly to a terminator for power lines communicating between such motor drives and a connected AC motor.

Common AC induction motors use three-phase electrical power connected to stator windings of the motor. Each stator winding receives a different conductor of a three-phase power source, in which each conductor communicates an AC power waveform shifted with respect to the other conductors by plus and minus 120°.

The three-phase power source to which the AC motor is connected may be line power or a solid-state motor drive connected to line power and synthesizing new three-phase power to drive the AC motor. This synthesized three-phase power, for example, may have a different frequency than line power to provide for motor speed control or control of other motor parameters.

The motor drive may communicate with the AC motor by means of a power cable extending hundreds or even thousands of feet. Such power cables normally include three power phase conductors and one or more ground conductors within a conductive shield, the latter to reduce the transmission of electrical interference to surrounding equipment.

The distributed inductance and capacitance of the power cable can create electrical reflections along the power cable, reflections occurring at points of impedance mismatch between the characteristic impedance of the power cable and the motor and/or the drive. These reflections produce voltage and current surges that can damage insulation on the power cable or motor, cause arcing across motor bearings, and boost the back-voltage to the motor drive damaging it or causing it to shut down.

U.S. Pat. No. 5,831,410 assigned to the assignee of the present invention and hereby incorporated by reference, describes a terminator that may be attached to the conductors of the power cable to significantly decrease reflection and thus voltage and current surges. This terminator provides a series capacitor and resistor connected between each of the three conductors to provide impedance matching between the motor and the power line thereby reducing reflection.

The present inventors have recognized that there are, in fact, two different impedances associated with the power cable and, as a result, two different reflection modes. The first reflection mode is related to the cable's common-mode impedance while the second reflection mode is related to the power cable's differential-mode impedance. The prior art terminator reduced differential-mode reflection (and hence transients) while still permitting common-mode reflections and transients.

These latter common-mode voltage transients can cause premature bearing failure by creating a condition for arcing across the bearings, pitting the finely machined bearing surfaces. Common-mode voltage transients also contribute to other transient related problems, including the transmission of electrical interference to surrounding equipment.

These two modes of reflection in the power cable have also been recognized in the paper, "Transmission Line Effects on Motor Feed Cables: Terminator Design and Analysis in the Laplace-Domain" by B. Bolsens et al. (2003). In this paper, Bolsens proposes a terminator electrically similar to that described in the above U.S. Pat. No. 5,831,410 but employing a "wye" rather than a "delta" configuration, with the important addition of a "common-mode" resistive matching element extending between a common tie point for each of the impedance matching elements (series resistors and capacitors connected to each of the conductors) and ground to reduce common-mode reflection.

BRIEF SUMMARY OF THE INVENTION

The present inventors have determined that, particularly for high power AC motors, the benefits of reducing common-mode reflection can be achieved with significantly less power dissipation in the terminator by the introduction of a small series capacitance with the "common-mode" resistive matching element. This capacitance can reduce by over 10% the power dissipated in the common-mode damping resistor with little effect on transient suppression. While the resistive elements are chosen to match the impedances of the reflection modes of the power cables, the choice of the value of the capacitive elements presents a trade-off between the power dissipated in the resistive element and the maximum peak transient voltage at the terminals of the motor. The capacitance in series with the common-mode resistive element provides the ability to independently control the transients for differential-mode and common-mode reflected wave transients for arbitrary power cables, while also reducing the total power dissipated in the resistive matching elements.

Specifically then, the present invention provides a terminator for reducing electrical transients on power cables having three power phase conductors and one or more ground conductors to conduct three-phase power to an AC motor from a solid-state motor drive. The terminator includes three differential-mode damping elements each having a series connected resistive and capacitive component, the differential-mode damping elements connected to each of the three conductors to provide equal impedances from each conductor to the other conductors. At least one common-mode damping element having a series connected resistive and capacitive component provides a path from each conductor to ground. The differential-mode damping elements provide impedance between each of the conductors substantially equal to a differential-mode characteristic impedance of the power cable, and the common-mode damping element provides an impedance between each of the conductors and ground substantially equal to a common-mode characteristic impedance of the power cable.

It is thus one object of one embodiment of the invention to provide a terminator that reduces both common-mode and differential-mode reflections with substantially reduced power dissipation. The capacitive component in series with the common-mode damping element helps provide a lower wattage design.

The differential-mode impedance elements may connect from each conductor to a common point and the common-mode impedance element may connect from the common point to ground.

It is thus an object of one embodiment of the invention to provide a reduced parts count implementation of the invention employing a wye-configuration.

The differential-mode impedance elements may provide a series connected resistance of substantially 33 ohms and capacitance of substantially 126 nF and the common-mode impedance elements may provide a series connected resistance of substantially 4 ohms and substantially 900 nF.

It is thus an object of one embodiment of the invention to provide a terminator suitable for standard power cables.

The differential-mode impedance elements may connect from each conductor to the other conductors and three common-mode impedance elements may connect from each conductor to ground.

It is thus an object of one embodiment of the invention to provide an alternative delta configuration of the terminator.

The power cable may be attached at a first end to the solid-state motor drive and at a second end to the AC motor and the terminator may be attached to the conductors proximate to the AC motor.

It is thus an object of one embodiment of the invention to provide a method of managing transients on the power cables communicating with AC motors that can be implemented at the connection between the power cable and the motor.

The motor drive may provide a voltage of over 500 volts to the AC motor and/or the resistances of the terminator may provide a combined power dissipation of over 500 watts.

It is thus another object of one embodiment of the invention to provide an energy efficient terminator suitable for high-power motor drives.

These particular features and advantages may apply to only some embodiments falling within the claims and thus do not define the scope of the invention.

DETAILED DESCRIPTION OF THE PREFERRED EMBODIMENT

Figure 1:
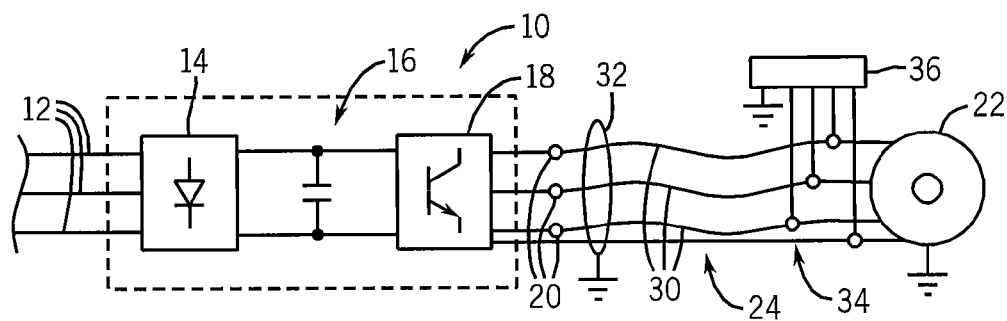
FIG. 1 is a block diagram of a standard motor drive employing a terminator of the present invention.

Referring to FIG. 1, a typical motor drive 10 will receive three-phase power 12 from a line source at a rectifier 14 of the motor drive 10. The rectifier 14 may convert the three-phase power 12 into DC power on a DC link 16 through passive or active rectification systems of a type known in the art.

The DC power on the DC link 16 is received by an inverter 18 of the motor drive 10 which synthesizes new three-phase power 20, for example, having a different frequency from the three-phase power 12 of the line source, to provide for motor speed control or control of other motor parameters. The synthesized three-phase power 20 may be communicated to a motor 22 by means of a power cable 24 having three conductors 30, one or more ground conductors 23, and an external grounded shield 32.

The power cable 24 may attach to the motor 22 at terminals 34 that also provide a connection point to the terminator 36 of the present invention.

Figure 2:
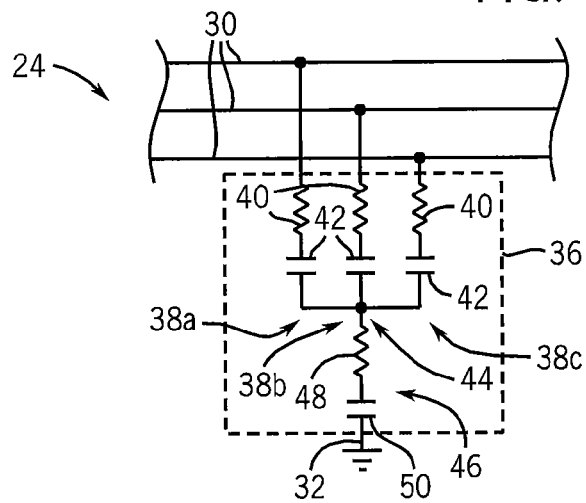
FIG. 2 is a schematic representation of a first embodiment of the terminator having a wye-configuration.

Referring now to FIG. 2, the terminator 36, in a first embodiment, may provide for three differential-mode damping elements 38a-c. Each of these damping elements may comprise a series connected resistor 40 and capacitor 42. Generally the order of the resistor 40 and capacitor 42 in a series connection does not matter. In addition, the resistor 40 and capacitor 42 may be implemented through multiple series or parallel-connected capacitors and resistors.

The resistor 40 and capacitor 42 are selected such that the total series impedance and thus the impedance between any two conductors 30 through differential-mode damping elements 38 will be substantially equal to the differential-mode characteristic impedance of the power cable 24 and the peak line-line voltage measured at the motor terminals will be limited to the desired value. In practice, the differential-mode impedance is measured from one end of any conductor 30 to the other two conductors connected to each other at that end, with all three conductors connected to each other at the other end. This differential impedance measurement normally involves the application of a voltage step across the conductors 30 and measurement of the amplitude of the resulting current pulse. For a typical power cable 24 the differential-mode impedance of approximately 50 ohms may be matched when the resistor 40 is substantially 33 ohms. When the capacitor 42 is substantially 126 nF, the peak motor terminal voltage measured from phase to phase is limited to about 140% of the DC voltage on the DC link 16 of the motor drive 10.

Each of the differential-mode damping elements 38a connects at one end to a different one of conductors 30 and at the other end to a common point 44 in a so-called wye-configuration.

The common point 44 in turn connects to one end of a common-mode damping element 46 comprised of a series connected resistor 48 and capacitor 50. In this case, the resistor 48 and capacitor 50 are selected such that the total impedance between any conductor 30 and the ground (the shield 32) through common-mode damping element 46 will be substantially equal to the common-mode characteristic impedance of the power cable 24 and the peak common-mode voltage at the motor terminals will be limited to the desired value. A common-mode impedance measurement connects the ends of all three of the conductors 30 together and applies a step voltage between ground and the commonly connected conductors 30 and measures of the amplitude of the resulting current pulse.

For a typical power cable 24 the common-mode impedance of approximately 15 ohms may be matched when the resistor 48 is substantially 4 ohms. When the capacitor 50 is substantially 900 nF, the peak line to ground voltage and peak common-mode voltage measured at the motor terminals is limited to about 90% and 70% respectively of the DC voltage on the DC link 16 of the motor drive 10.

Again, generally the order of the resistor 48 and capacitor 50 in a series connection does not matter. In addition, at the resistor 48 and capacitor 50 may be implemented through multiple series or parallel-connected discrete devices. Further, it will be understood that the common-mode damping element 46 may be implemented by three separate elements (not shown) connected individually between the three conductors 30 and ground. As before, the common-mode damping elements 46 consists of series connected resistor 48 and capacitor 50, but in this case, the resistor 48 is preferably 45 ohms and the capacitor 50 is preferably 90 nF. In this embodiment, resistors 40 of the differential mode damping elements 38 would be adjusted to be 108 ohms and the capacitances 42 would be preferably 36 nF.

Figure 3:
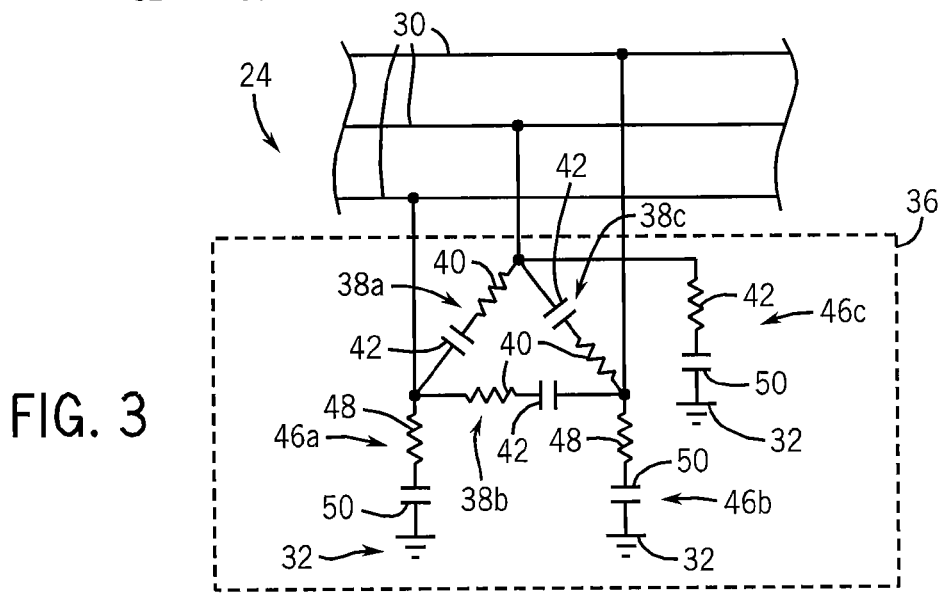
FIG. 3 is a diagram of a second embodiment of the invention having a delta configuration.

Referring now to FIG. 3, in an alternative embodiment, each of the three differential-mode damping elements 38a-c may be connected between two different conductors 30 in a so-called delta configuration. As a result of the changed topology, the resistor 40 will be increased to 325 ohms and the capacitor decreased to 12 nF for the same power cable 24 having a differential-mode impedance of 50 ohms.

In this embodiment, three common-mode damping elements 46a-c are used, each connecting a different conductor 30 to ground. In this configuration, the value of resistor 48 of the common-mode damping elements 46 will be 45 ohms and capacitors 50 will be 90 nF for a power cable 24 with a common-mode characteristic impedance of 15 ohms.

TABLE I

|  | Un-terminated power cable | Prior Art differential-mode termination only | Prior art differential-mode and common-mode termination | Differential-mode and common-mode termination with common-mode capacitance |
|---|---|---|---|---|
| Peak line-to-ground voltage | 1500 V | 1200 V | 900 V | 900 V |
| Peak line-to-line voltage | 2000 V | 1400 V | 1400 V | 1400 V |
| Peak common-mode voltage | 1000 V | ~1000 V | 700 V | 700 V |
| Terminator power dissipation | 0 W | 600 W | 900 W | 800 W |

Table I shows a simulation of the various circuits described above used with 8-AWG power cable with a 25 hp motor operated with a pulse width modulation motor drive at approximately 690 V input voltage. As can be seen in the last two columns, the present invention provides a decrease in terminator power dissipation of over 100 W without significant degradation in ability to terminate common-mode peak voltages.

Because the common-mode characteristic impedance and differential-mode characteristic impedance of power cable 24 are essentially independent of cable length, a terminator 36 may be constructed with the fixed values of resistance and capacitance for a given type of cable and used freely with a variety of lengths of that cable long enough to present significant reflection problems.

It is specifically intended that the present invention not be limited to the embodiments and illustrations contained herein and the claims should be understood to include modified forms of those embodiments including portions of the embodiments and combinations of elements of different embodiments as come within the scope of the following claims. For example, while the present invention describes three-phase motors and drives it will be understood that the present invention will apply to higher order phases and that the term "three-phase" should be considered to embrace any system having at least three phases.

We claim:

1. A terminator for reducing electrical transients on a power cable having three conductors to provide three-phase power to an AC motor from a solid-state motor drive, the terminator comprising:

three differential-mode damping elements each having a series connected resistive and capacitive component, the differential-mode damping elements connected to each of the three conductors to provide equal impedances from each conductor to the other conductors;

at least one common-mode damping element having a series connected resistive and capacitive component, the common-mode damping element providing a path from each conductor to ground;

wherein the differential-mode damping elements provide impedance between each of the conductors substantially equal to a differential-mode characteristic impedance of the power cable and wherein the common-mode damping element provides an impedance between each of the conductors and ground substantially equal to a common-mode characteristic impedance of the power cable.

2. The apparatus of claim 1 wherein the differential-mode impedance elements connect from each conductor to a common point and the common-mode impedance element connects from the common point to ground.

3. The terminator of claim 2 wherein the differential-mode impedance elements provide a series connected resistance of substantially 33 ohms and capacitance of substantially 126 nF and the common-mode impedance elements provide a series connected resistance of substantially 4 ohms and substantially 900 nF.

4. The terminator of claim 1 wherein the differential-mode impedance elements connect from each conductor to the other and three common-mode impedance elements connect from each conductor to ground.

5. The terminator of claim 4 wherein the differential-mode impedance elements provide a series connected resistance of substantially 325 ohms and capacitance of substantially 12 nF and the common-mode impedance elements provide a series connected resistance of substantially 45 ohms and substantially 90 nF.

6. The terminator of claim 1 wherein the power cable is attached at a first end to the solid-state motor drive and at a second end to the AC motor and wherein the terminator is attached to the conductors proximate to the AC motor.

7. The terminator of claim 1 wherein the motor drive provides a voltage of over 500 volts to the AC motor.

8. The terminator of claim 1 wherein the resistances of the terminator provide a combined power dissipation of over 500 watts.

9. A method for reducing electrical transients on a power cable having three conductors providing power to an AC motor driven by a solid-state motor drive, the method comprising the steps of:

(a) connecting three differential-mode damping elements each having a series connected resistive and capacitive component between each of the three conductors to provide equal impedances from each conductor to the other conductors;

(b) providing a path from each conductor to ground through at least one common-mode damping element having a series connected resistive and capacitive component;

wherein the differential-mode damping elements provide impedance between each of the conductors substantially equal to a differential-mode characteristic impedance of the power cable and wherein the common-mode damping element provides an impedance between each of the conductors and ground substantially equal to a common-mode characteristic impedance of the power cable.

* * * * *